United States Patent [19]

Taguchi

[11] Patent Number: 5,896,320
[45] Date of Patent: Apr. 20, 1999

[54] SEMICONDUCTOR MEMORY DEVICE

[75] Inventor: Masao Taguchi, Sagamihara, Japan

[73] Assignee: Fujitsu Limited, Kawasaki, Japan

[21] Appl. No.: 08/439,906

[22] Filed: May 12, 1995

Related U.S. Application Data

[63] Continuation of application No. 08/221,554, Apr. 1, 1994, abandoned, which is a continuation of application No. 07/711,046, Jun. 6, 1991, abandoned.

[30] Foreign Application Priority Data

Jun. 7, 1990 [JP] Japan ............................ 2-149444

[51] Int. Cl.$^6$ ............................ G11C 11/40
[52] U.S. Cl. ............................ 365/226; 327/57
[58] Field of Search ............................ 365/226, 189.01, 365/189.09, 189.11; 327/51, 57

[56] References Cited

U.S. PATENT DOCUMENTS

| | | | |
|---|---|---|---|
| 4,262,341 | 4/1981 | Mogi et al. | 365/205 |
| 4,365,316 | 12/1982 | Iwahashi | 307/304 |
| 4,636,981 | 1/1987 | Ogura | 365/226 |
| 4,691,123 | 9/1987 | Hashimoto | 307/296.3 |
| 4,843,594 | 6/1989 | Tanaka et al. | 365/189.09 |
| 5,030,859 | 7/1991 | Ihara | 307/530 |
| 5,127,739 | 7/1992 | Duvvury et al. | 365/189.11 |

OTHER PUBLICATIONS

Fujii et al., "A 45 ns 16Mb DRAM With Triple-Well Structure", *IEEE International Solid-State Circuits Conference*, Feb. 1989, vol. 32, pp. 248-249, 354.

Kitsukawa et al., "A 1-Mbit BiCOMS DRAM Using Temperature-Compensation Circuit Techniques", *IEEE Journal of Solid-State Circuits*, Jun. 1989, vol. 24, No. 3, pp. 597-602.

Furuyama et al., "A New On-Chip Voltage Converter for Submicrometer High-Density DRAM'S", *IEEE Journal of Solid-State Circuits*, Jun. 1987, vol. 22, No. 3, pp. 437-441.

*Primary Examiner*—Toan Tran
*Attorney, Agent, or Firm*—Greer, Burns & Crain, Ltd.

[57] ABSTRACT

A semiconductor memory device comprises a bit line, a memory cell connected to the bit line, a sense amplifier, a power source for providing a first voltage to the sense amplifier as an operational power source voltage, a MOS transistor connected between the sense amplifier and the bit line and a stabilized power source for providing to a gate electrode of the MOS transistor a second voltage lower than the first voltage, so that a restore voltage of the memory cell is determined by the source voltage of the MOS transistor.

8 Claims, 7 Drawing Sheets 5,896,320

SEMICONDUCTOR MEMORY DEVICE

RELATED APPLICATION

This is a continuation of application Ser. No. 08/221,554, filed Apr. 1, 1994, now abandoned, which is a continuation of application Ser. No. 07/711,046 filed Jun. 6, 1990, now abandoned.

BACKGROUND OF THE INVENTION

1. [Field of the Invention]

The present invention relates to a semiconductor memory device and, more particularly, to gate circuits of MOS transistors for connecting sense amplifier to bit lines in a DRAM.

With increase in high-packing densities of DRAMs, the physical size of memory cells has been made smaller and smaller recently. As the size of a memory cell becomes smaller, the gate length of a transistor used in the memory cell becomes shorter and shorter. For example, it is of the order of 0.9 μm in 4M bit and of the order of 0.5 μm in 16M bit. If the gate length is made short, the withstand voltage of a transistor will inevitably become low. Thus, it is required to lower a voltage applied to memory cells. Also, power dissipation of a memory cell array can be reduced by lowering voltage applied to a memory cell, namely, the magnitude of voltage on a bit line. Thereby, it becomes possible to avoid an increase of power dissipation resulting from an increase of the number of bit lines which are charged or discharged simultaneously with an increase in packing density.

2. [Related Art]

The connection between sense amplifiers and bit lines is almost always made through MOS transistors. These MOS transistors have mainly the following three objects.

(1) The first is to insert a resistive component, which is the channel resistance of an MOS transistor, between a sense amplifier and bit lines to form a CR time constant with capacitance associated with the bit lines and to prevent the bit-line capacitance from being imposed on the sense amplifier as a large capacitive load at the time of operation of the sense amplifier. To this end, the MOS transistor has only to remain conductive. That is, it is necessary only that the gate of the transistor be connected to an externally applied supply voltage Vcc.

(2) The second is to control the gate of the transistor by means of clocks so that it can be turned off when the sense amplifier operates and the bit line can be prevented from being imposed on the sense amplifier as a load. In this case, the gate of the transistor is connected not to a power supply directly but to a clock generating circuit. Since clocks control the gate of the transistor in synchronism with RAS clocks, the clock generator, as part of a row peripheral circuit, is powered from a power supply of the row peripheral circuit or an external power supply.

(3) The third is to use the transistor as an array select switch in the case of a shared sense amplifier which is shared among two pairs of bit lines. As a change-over switch the transistor is connected between the sense amplifier and the bit line. A transistor on the side of a cell array to be selected is rendered conductive and the other transistor is rendered nonconductive. The relationship among the conducting transistor, the sense amplifier and the bit line is the same as that in (1).

In any of the above cases, the transistor for connecting the sense amplifier with the bit line is not used as means for determining a voltage to be written into an memory cell but used merely as a array select switch in the case of the shared sense amplifier, a time-constant forming resistance, etc.

FIG. 1 illustrates power distribution in a hypothetical DRAM. The dynamic RAM is composed of a blocked cell array 10, a sense amplifier group 11, a RAS (Row Address Strobe) peripheral circuit 12, a CAS (Column Address Strobe) peripheral circuit 13 and a data output peripheral circuit 14. The peripheral circuit 14 is generally supplied with a supply voltage Vcc of 5V, the peripheral circuits 12 and 13 are supplied with Vcc2 of, for example, 4V that is produced from the Vcc, and the sense amplifier group 11 is supplied with a voltage Vcc1 of, for example, 3.3 V that is produced from the Vcc. MOS transistors Q1, Q2, ..., Qn, which connect bit lines of the cell array with the sense amplifiers, have their gates connected to the power supply Vcc in this example and thus function as mere resistors.

When the gates of the MOS transistors are connected to Vcc, i.e., an external power supply, a maximum voltage of the bit lines, i.e., a restore voltage to cells becomes Vcc - Vth which is lower than the supply voltage Vcc. The restore voltage thus obtained tracks the supply voltage so that it always becomes the threshold voltage Vth less than the supply voltage Vcc. The restore voltage on the bit line will also vary as the supply voltage varies. Simply connecting a transistor between a bit line and a sense amplifier and connecting its gate to the supply voltage Vcc, which will lower the operating voltage within a memory cell by about 0.7 V, is not useful as means of limiting the operating voltage stable.

Heretofore there are the following two methods for limiting a voltage applied to a memory cell stable.

(1) A voltage (for example, 3.3 V) is produced within a chip from an externally supplied voltage (for example, 5V) and then used as a supply voltage for the entire circuit in the chip. A voltage transform circuit used for this voltage transformation is well designed to produce a voltage which remains steady irrespective of variations in temperature and externally supplied voltage. Thus, even if the structure of a memory cell is made fine, the voltage transform circuit has only to generate a voltage most suitable for the cell. This method is simple in conception. However, with this method, a voltage for cells which require to be made fine rapidly as packing densities improve and a voltage for peripheral circuits which do not affect the size of a chip even if they are not made fine so rapidly cannot be made independent of each other. Thus, the method is not necessarily suited for an optimum design. With a dynamic RAM in which current dissipation varies dynamically, an instantaneous current produced by the operation of part of circuits has an effect on other circuits as noise. Therefore, with the method which supplies all of circuits within a chip with a common voltage produced by lowering an external supply voltage within the chip, it is not easy to render stable a voltage applied to the cell array.

(2) Within a chip a voltage (for example, 4V) is produced from an external supply voltage (for example, 5V) for application to peripheral circuits. At the same time, a separate voltage (for example, 3.3V) produced within the chip is applied to sense amplifiers so as to lower the voltage applied to the cell array which has progressed in miniaturization. FIG. 1 illustrates this example. Vcc1 is set at 3.3 V and Vcc2 is set at 4V. With this method, the sense amplifiers having a great instantaneous current variation and the peripheral circuits can be operated from separate power supplies. Thus, there is an advantage that the sense amplifiers will provide no noise to other circuits. However, with this method which limits the magnitude of a restore voltage on a bit line with the sense amplifier, the lower the voltage becomes, the smaller the driving power of the sense amplifier for driving data buses becomes. This disadvantageously makes long address access times on the side of columns. This disadvantage will be caused in (1) as well when the voltage is lowered.

In the case where, in that way, a voltage for driving the memory cell array is lowered in accordance with the extent of miniaturization of memory cells, if the voltage is lowered for common use with other circuits, stabilization of voltage within a chip will be difficult because a load current varies heavily in a DRAM. Specifically, voltage control must be performed by the use of a large-sized transistor which can drive a large instantaneous current and moreover the large-sized transistor requires a large-sized driving amplifier consuming a large amount of power. The stabilization of the feedback loop of a control circuit is not easy. Moreover, voltages for a cell array and peripheral circuits cannot always be optimized. Furthermore, even in the case where the peripheral circuits and the sense amplifiers are driven by separate voltages that are generated within a chip, if the amplitude of the sense amplifier were lowered in accordance with a desired voltage of the cell array, the access time would be prolonged.

SUMMARY OF THE INVENTION

An object of the present invention is to permit a constant low voltage to be applied to a cell array without being affected by variations in load current, permit sense amplifiers to operate with a relatively large amplitude so as to drive a data bus hard, and avoid an increase in current dissipation.

A feature of the present invention resides in a semiconductor memory device comprising a bit line, a memory cell connected to the bit line, a sense amplifiers, a first means for providing a first voltage to the sense amplifier as an operational power source voltage, a MOS transistor connected between the sense amplifier and the bit line and a second means for providing to a gate electrode of the MOS transistor second voltage lower than the first voltage.

A semiconductor memory device includes sense amplifiers, said memory device comprising a power supply means (Vcc1, Vcc2) for the sense amplifiers, wherein chip stabilized power supply circuit which is independent of said power supply means, means for supplying gate voltages of MOS transistors (Q1, Q2, ...) connecting bit lines to sense amplifiers are supplied from said within-chip stabilized power supply circuit and means for determining restore voltages to memory cells by source voltages of the MOS transistors.

PREFERRED EMBODIMENTS

Figure 1:
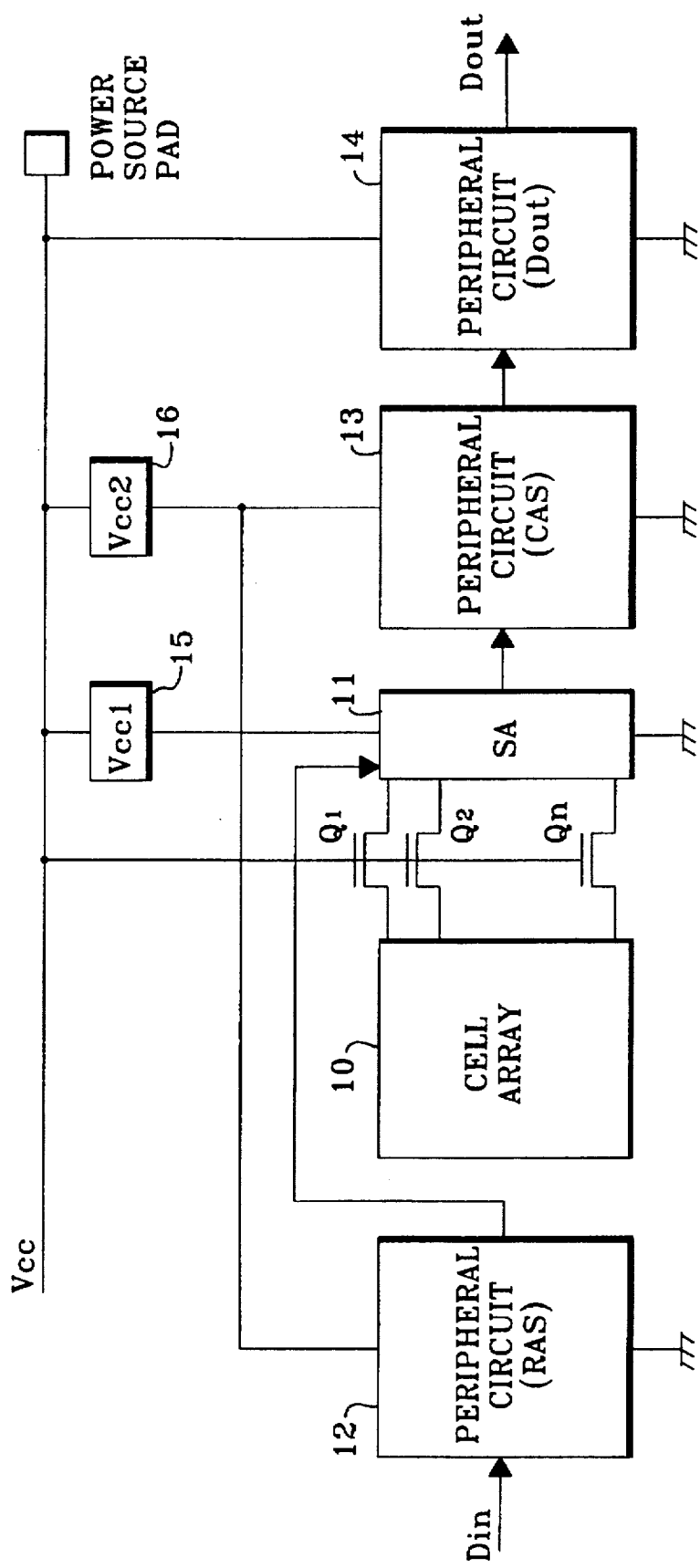
FIG. 1 is a block diagram of a configuration of a device which may be supposed to be presented in future.
Figure 2:
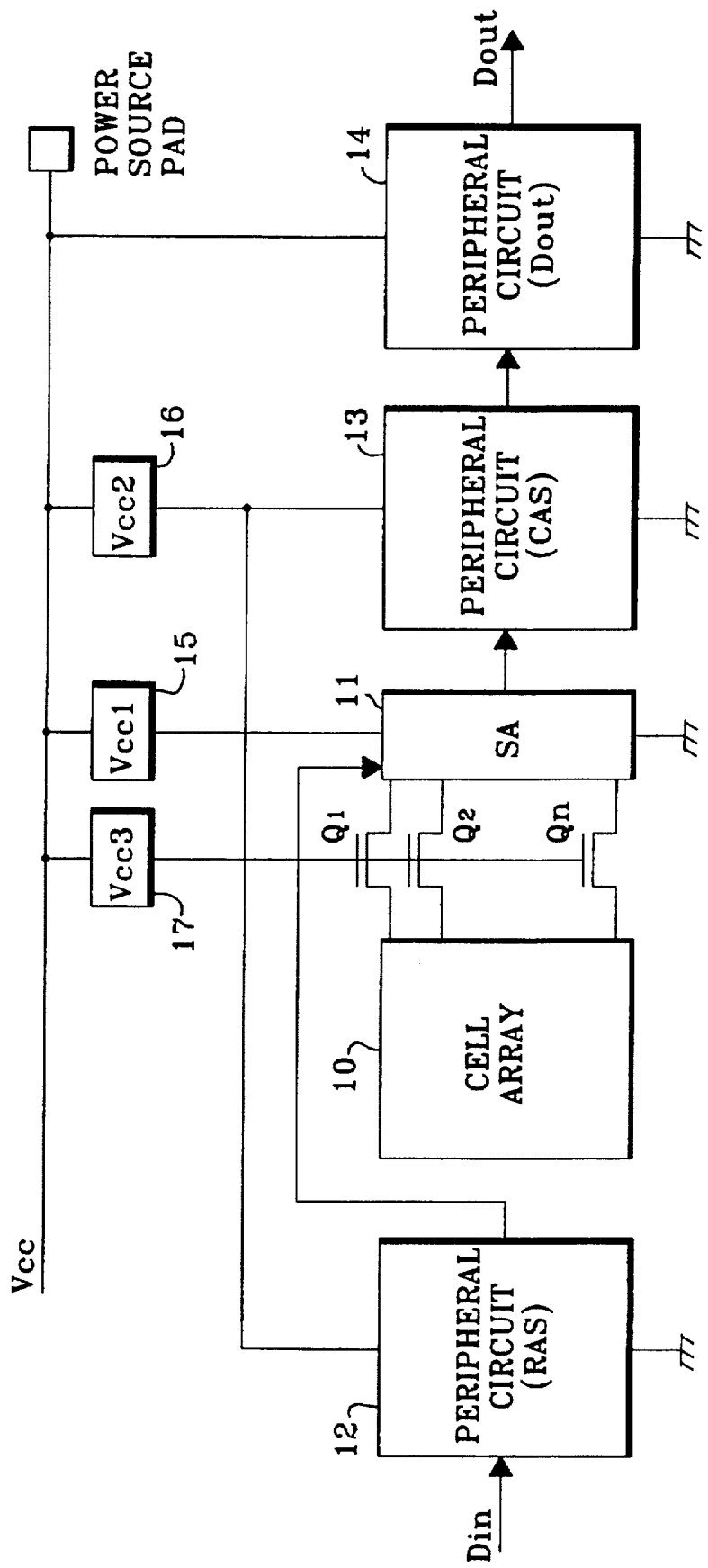
FIGS. 2 and 3 illustrate first and second principles of the present invention, respectively.

As shown in FIG. 2, in the principle block diagram of the present invention, the gates of MOS transistors Q1, Q2, ..., Qn, each of which connects bit lines of a cell array 10 to a corresponding sense amplifier in a sense amplifier group 11, are driven by a power supply 17 which is independent of a power supply 15 for the sense amplifier group and a power supply 16 for peripheral circuits.

The power supply 17 is a stabilized power supply which outputs a constant voltage. It is preferred that the constant voltage "2.2v" for example, be lower than a voltage (an output voltage) that a sense amplifier eventually outputs after amplification. The output of the stabilized power supply determines an output of the memory cell, which is amplified by a sense amplifier. It doesn't matter whether each of the power supplies 15 and 16 is a stabilized power supply or not. If the supply voltage is Vcc, the power supplies 15 and 16 can be mere wires.

With a shared sense amplifier system, one sense amplifier group is provided for two cell arrays. The cell arrays are selectively connected to the sense amplifier group by means of MOS transistors. Thus, a gate driving circuit for the MOS transistors is a logic circuit. The MOS transistors are turned on and off according to a cell array to be connected, specifically, a row (word lines) address. If, for example, the first half of Q1 to Qn are used for the first cell array and the second half thereof are used for the second cell array, a logic circuit 17A turns the first half and the second half of Q1 to Qn on and off, respectively, when making access to the first cell array. In the present invention, at least power of the final stage of the logic circuit 17A is supplied from a within-chip stabilized power supply which is independent of power supplies for the sense amplifiers and the peripheral circuits so that the transistors Q1 to Qn can be driven by a constant voltage.

It is desired that the constant voltage be lower (2.2v for example,) than a voltage (3.3v for example,) (output voltage) that the sense amplifier reaches after amplification.

If, in this way, the gates of the MOS transistors connecting the bit lines to the sense amplifiers are driven by a constant voltage which is less than an output voltage (3.3v, for example) of the sense amplifiers and supplied from the stabilized power supply 17 or the logic circuit 17A, the source voltage (1.6v, for example) of each of the MOS transistors and hence the bit-line voltage (1.6v, for example) are controlled by the constant voltage to assume a constant value, with the result that it is not affected by variations in load current.

Moreover, since the bit-line voltage and hence the restore voltage of memory cells are determined by the constant voltage, the cell arrays can be speeded up by the use of low voltage and small amplitude, while the sense amplifiers can drive the data bus hard and be speeded up by the use of large amplitude.

The loads of the stabilized power supplies 17 and 17A, which are only gate circuits of the MOS transistors Q1 to Qn, are light. Thus, the stabilization of the output voltages of the power supplies is easy and requires no large-current handling devices and large power consumption.

Figure 3:
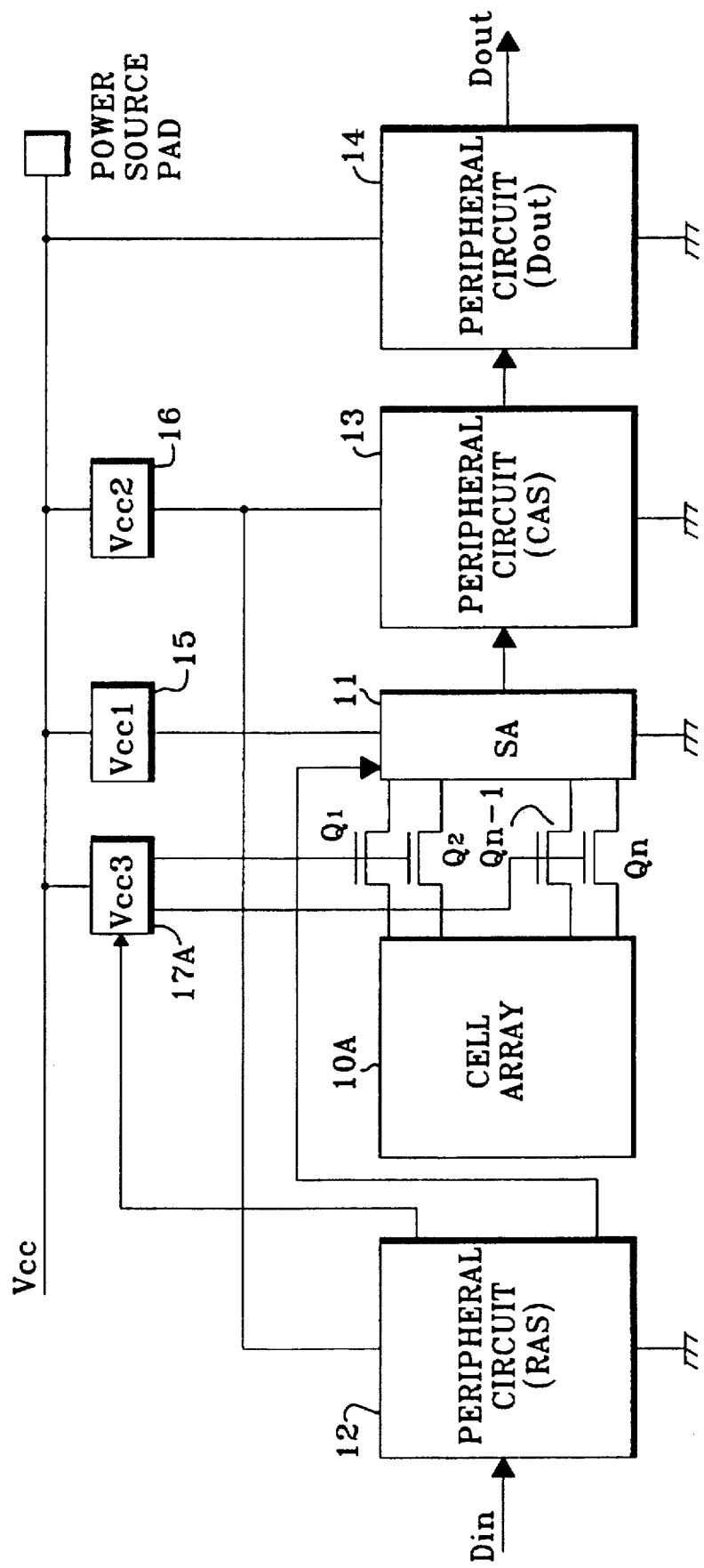
Figure 4:
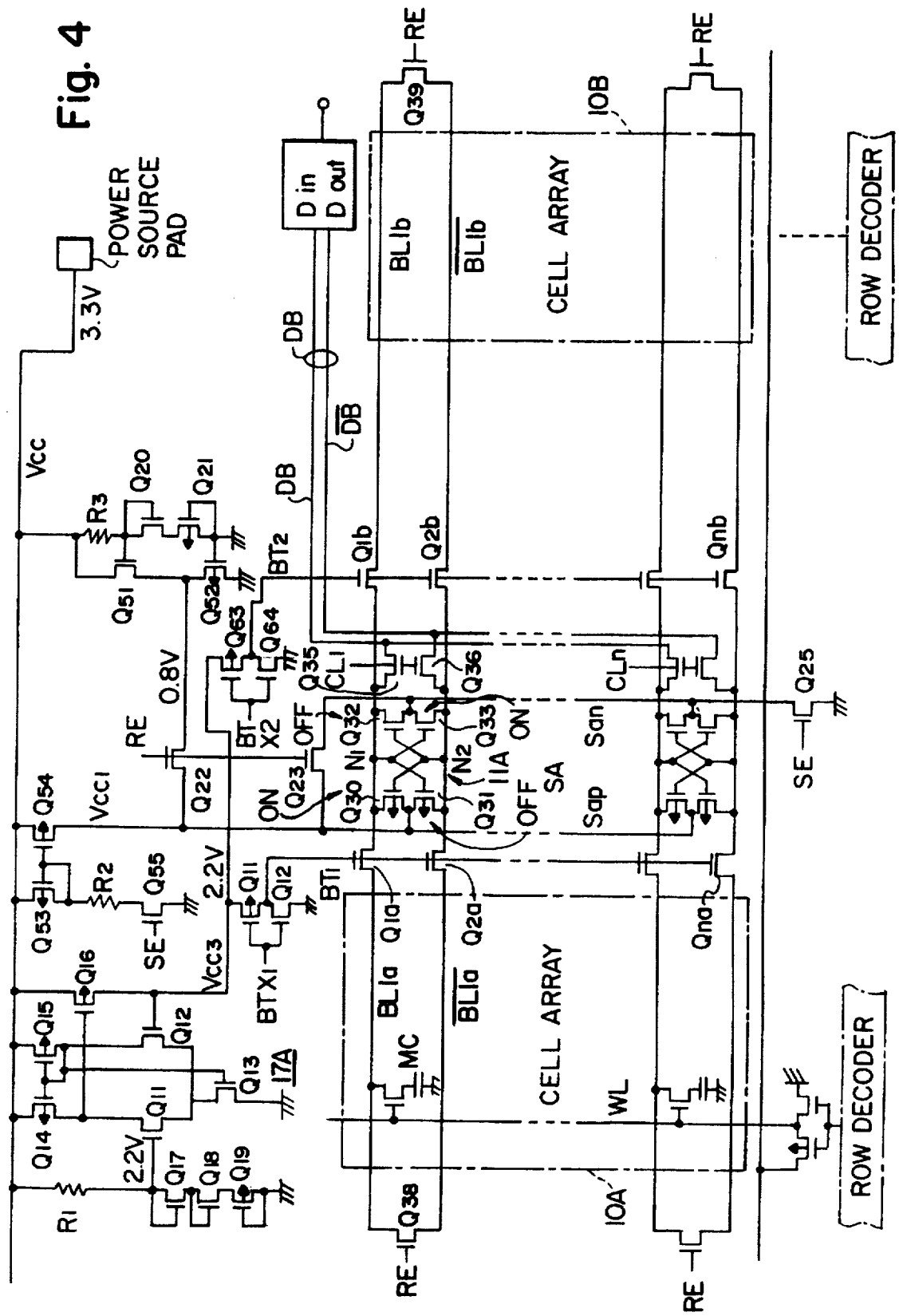
FIG. 4 is a circuit diagram of an embodiment of the present invention.

FIG. 4 illustrates an embodiment of the present invention. This embodiment relates to a shared sense amplifier configuration and thus corresponds to FIG. 3. In this embodiment the supply voltage Vcc is 3.3 V, and the supply voltage Vcc3 of logic circuits Q11 and Q12, .... for driving the gates of MOS transistors Q1a, Q1, ..., which connect bit lines BL1a, ... to sense amplifiers 11A is 2.2V. The power supply of the sense amplifiers is a constant current source. Thus, although its output voltage Vcc1 is not constant, the final voltage after amplification becomes close to Vcc. Note that the power supply 16 of peripheral circuits is not shown in FIG. 4.

A resistor R1, diode-connected n-channel MOS transistors Q17 and Q18 and p-channel MOS transistor Q19 in the power supply section of the logic circuit 17A provide a constant voltage of 2.2V. That is, a voltage drop of Vth (=0.6V) is developed across each of the transistors Q17 and Q18 and a voltage drop of Vth (=1V) is developed across the transistor Q19 and hence a voltage drop of 2.2V is developed. Note that Vth=1V of Q19 results from addition of the substrate bias effect to the threshold 0.8V of the common-source circuit. The voltage 2.2V is applied to the gate of a transistor Q11 of a differential pair of transistors Q11 and Q12, while the voltage Vcc3 of a feedback circuit (transistor Q16) is applied to the gate of the other transistor Q12 of the differential pair. For this reason, Vcc3 is automatically adjusted to be equal to 2.2V.

The logic section of the logic circuit 17A comprises CMOS inverters composed of transistors Q61 and Q62; and Q63 and Q64. When a row address belongs to a cell array 10A at the left, select signals BTX1 and BTX2 becomes L and H, respectively, so that the CMOS inverter composed of Q61 and Q62 provides an H (2.2V) output and the CMOS inverter composed of Q63 and Q64 provides an L (0V) output. Thus, the transistors Q1a, Q2a, ... are rendered conductive, while the transistors Q1b, Q2b, ... are rendered nonconductive, so that the cell array at the left is connected to the sense amplifiers. When the select signals BTX1 and BTX2 are H and L, respectively, on the other hand, a cell array 10B at the right is connected to the sense amplifiers. When the gate voltage of the transistors Q1a, ... is 2.2V, the bit line BL1a is at 1.6V that is Vth=0.6V lower than 2.2V. That is, the voltage of the bit line is a constant voltage that is lower than the supply voltage (3.3v, for example) of the sense amplifiers.

The load of the power supply circuit outputting the voltage Vcc3 is comprised of only gate circuits of the transistors Q1a to Qna and Q1b to Qnb and thus very light. Thus, it is easy to output a constant low voltage Vcc3 and there is no need for large-current handling devices. The power supply circuit is hardly affected by variations in large current resulting from operation of the sense amplifiers, the output circuit and so on. As a result, a restore voltage on a bit line, i.e., a voltage level used to write a 1 into a memory cell is always stable. In other words, if transistor Q1a is not provided, the output of the memory cell is used for the input to the sense amplifier, thereby enabling the input to the sense amplifier to be subjected to a variation. In the present embodiment, the gate voltage of transistor Q1a is fixed to 2.2V, for example, and thus, the source voltage of transistor Q1a is determined to be at 1.6V, for example, thereby fixing the output of the memory cell to 1.6V and avoiding a variation in the input voltage to the sense amplifier.

The power supply circuit of the sense amplifier group is constructed from transistors Q15 and Q54, a resistor R2 and a transistor Q55. When the transistor Q55 is rendered conductive in response to application of a sense enable signal SE thereto, a current will flow through the resistor R2. Since the transistors Q53 and Q54 constitute a current mirror, a constant current, which is determined by the resistor R2 and the supply voltage Vcc, will flow into Q54 and hence the sense amplifier group.

The sense amplifier operates in a known manner. A sense amplifier 11A has a flip-flop comprising transistors Q30, Q31, Q32 and Q33. When the bit line BL1a is rendered higher than the bit line $\overline{BL1a}$ by a memory cell MC selected by the word line WL, transistors Q33 and Q30 are rendered conductive, while transistors Q32 and Q31 are rendered nonconductive in the sense amplifier 11A. As a result, BL1a is pulled up to Vcc1 and $\overline{BL1a}$ is pulled down to ground potential through the transistor Q25 which is conducting at this time. Although Vcc1 eventually rises up to Vcc=3V, it is, as described above, up to 1.6V that BL1a is able to rise because of limitation by the transistors Q1a and Q2a. $\overline{BL1a}$ at the L level is pulled down to ground level by Q2a and Q33.

Transistors Q20, Q21, Q51, Q52 and resistor R3 constitute a circuit for generating a reset voltage, 0.8V in the present embodiment. Vth of the p-channel MOS transistors Q21 and Q52 is 0.8V, while Vth of the n-channel MOS transistors Q20 and Q51 is 0.6V. Thus, a constant voltage of 1.4V is applied to the gate of Q51, so that a constant current flows through Q51 and hence the transistor Q52 provides 0.8V. When a reset signal RE is applied at the time of resetting, the power supply of the sense amplifiers and the ground terminal are short-circuited by the transistor Q22 and Q23 turn on and 0.8V is applied by the transistor Q22. Thereby, the bit lines BL and $\overline{BL}$ (subscripts 1a, 1b and so on are omitted for simplicity) are reset to 0.8V which is half of 1.6V. At this time, clock SE is at an L level, so that the power supply Vcc of the sense amplifiers is inoperative and the transistor Q25 is nonconducting.

Transistors Q35 and Q36 constitute column gates which are turned on by outputs CL1 to CLn of a column decoder so as to apply outputs of the sense amplifiers onto data buses DB. This is done at the time of reading from the memory. At the time of writing into the memory, on the other hand, voltages on the data buses DB are applied to the bit lines BL and $\overline{BL}$.

Transistors Q38 and Q39 are adapted to short-circuit the bit lines BL and $\overline{BL}$ and turned on by the reset signal RE.

Figure 5:
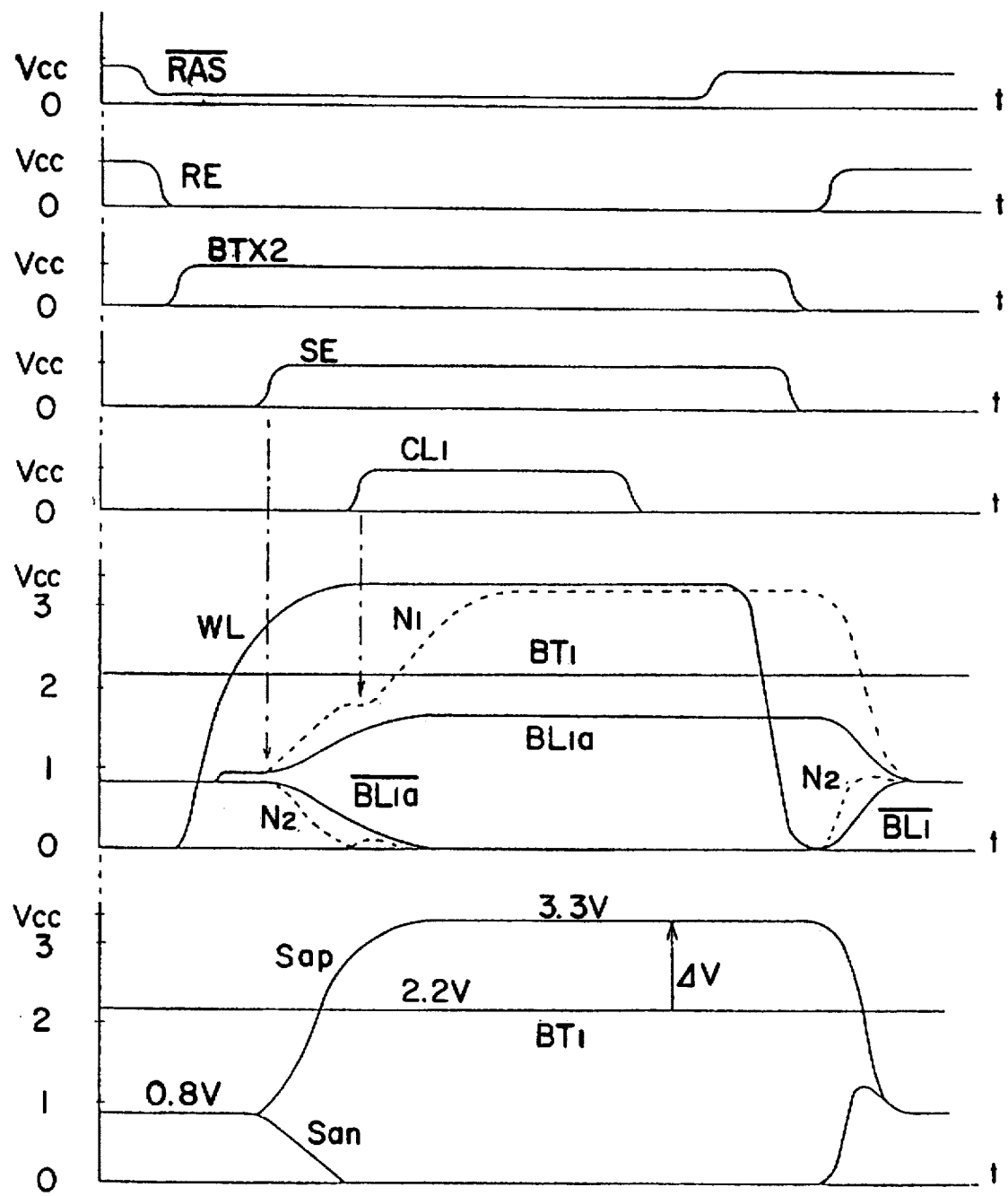
FIG. 5 is a waveform diagram for use in explanation of the operation of the circuit of FIG. 3.

FIG. 5 illustrates voltage waveforms developed at various parts in FIG. 4. When a RAS bar clock falls and thus the chip is placed in the select state, a reset clock RE falls and BTX, BTX2 in this embodiment, rises according to a row address. As a result, the cell array 10A at the left in FIG. 4 is connected to the sense amplifiers, while the cell array 10B at the right is disconnected from the sense amplifiers.

When the word line WL rises and a sense amplifier activating clock SE rises, the sense amplifiers amplify voltages of the bit lines. N1 and N2 denote output terminals of a sense amplifier which vary faster than the bit lines BL1a and $\overline{BL1a}$ as shown. The reason is that there are transistors Q1a and Q2a between the bit lines and the sense amplifier, and the bit-line capacitance is not directly connected to the sense amplifier because of channel resistances of these transistors.

When the output voltage of the sense amplifier becomes high to some extent, a column select signal CL1 is produced to turn the transistors Q35 and Q36 on, thereby connecting the data buses DB to the sense amplifier. The sense amplifier now drives the data buses as well, so that H level side rises to the neighborhood of Vcc. The H-level bit line BL1a goes no higher than 1.6V because the transistor Q1a starts to turn off in the neighborhood of 1.6V. In this way the restore voltage on the bit line is limited to 1.6V. When the transistor Q1a is turned off, the bit lines cease to be a load of the sense amplifier, thereby speeding up the amplifying operation of the sense amplifier. However, at substantially the same time, the data buses are connected to the sense amplifier as its load. The output of the sense amplifier eventually rises to the neighborhood of Vcc, so that the data buses are driven hard and access is speeded up.

Sap and San in FIG. 5 represent the high and low potential sides of the power supply of the sense amplifier. ΔV represents a difference voltage by which the sense amplifier is driven more than the gate voltage of the transistor Q1a.

In this way, by limiting the gate voltage of a transistor connecting bit lines to a sense amplifier to thereby define a restore voltage (1.6V) on the bit line and by driving the sense amplifier with a voltage (3.3V) higher than the restore voltage, it becomes possible to effect a reduction in power dissipation in a cell array and speed up memory access.

Figure 6:
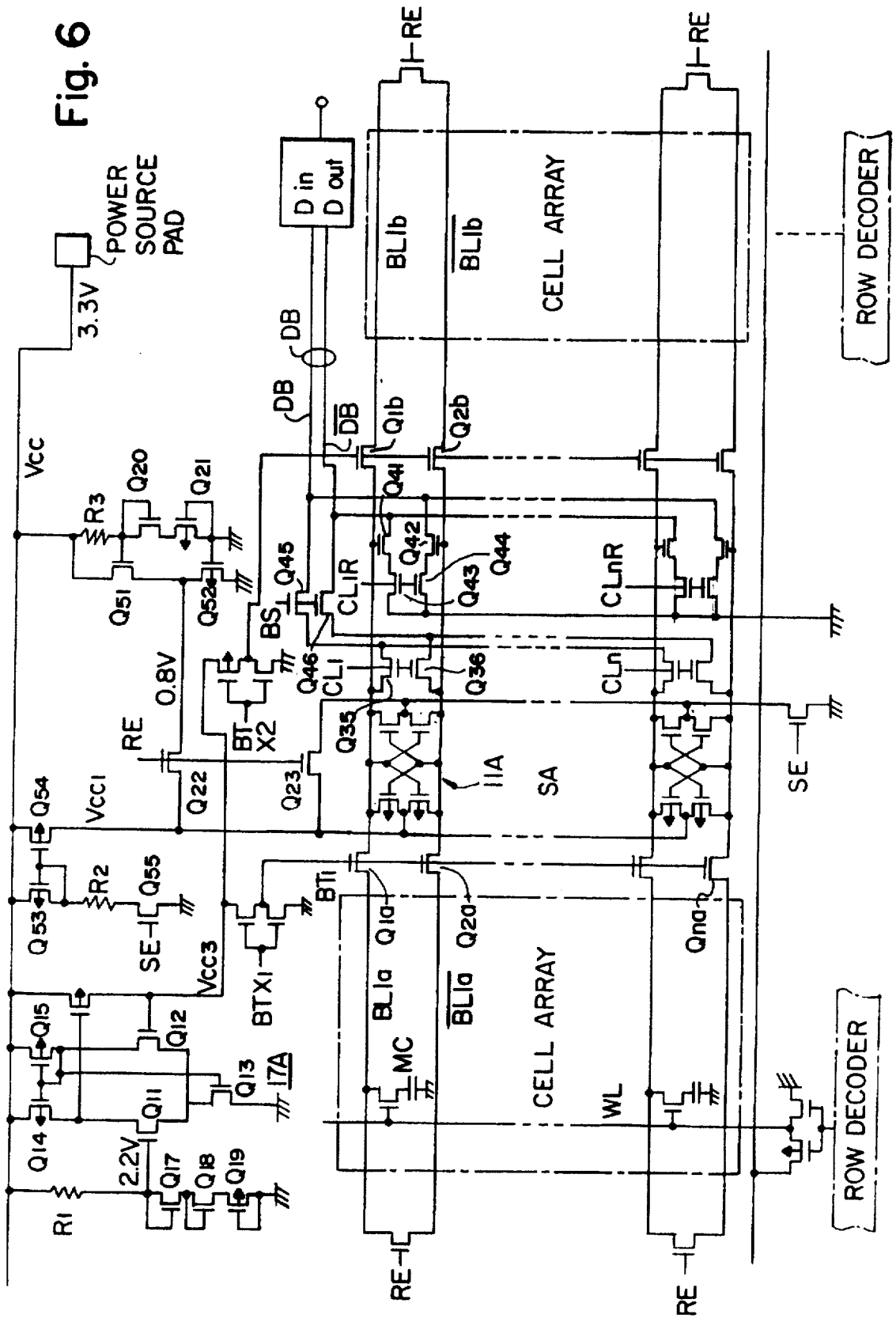
FIG. 6 is a circuit diagram of the other embodiment of the present invention.

FIG. 6 illustrates another embodiment of the present invention. Its basic configuration is the same as that of FIG. 4. In this embodiment, transistors Q41 to Q44 for connecting read-only bit lines to data buses are provided so as not to directly connect the bit lines to the data buses DB at the time of reading from a memory cell. That is, the bit lines are connected to the gates of the transistors Q41 and Q42 and data is read out with the transistors as buffers. A column is selected by driving the transistors Q43 and Q44 with a select signal CL1R. Thereby, the sense amplifier will be released from a capacitive load which would otherwise be provided by the data buses. This permits the amplifying operation of the sense amplifier to be performed faster.

As in a prior art, the writing of data can be performed by driving the transistors Q35 and Q36 with the select signal CL1. In order for wires used in write gate portions not to become additional capacitive loads in reading from the memory, the gates of transistors Q45 and Q46 are controlled by a clock BS so as to disconnect the wires at the time of reading from the memory.

In the present invention, the gates of MOS transistors connecting bit lines to sense amplifiers are driven by output voltages of the stabilized logic circuit 17A.

Figure 7:
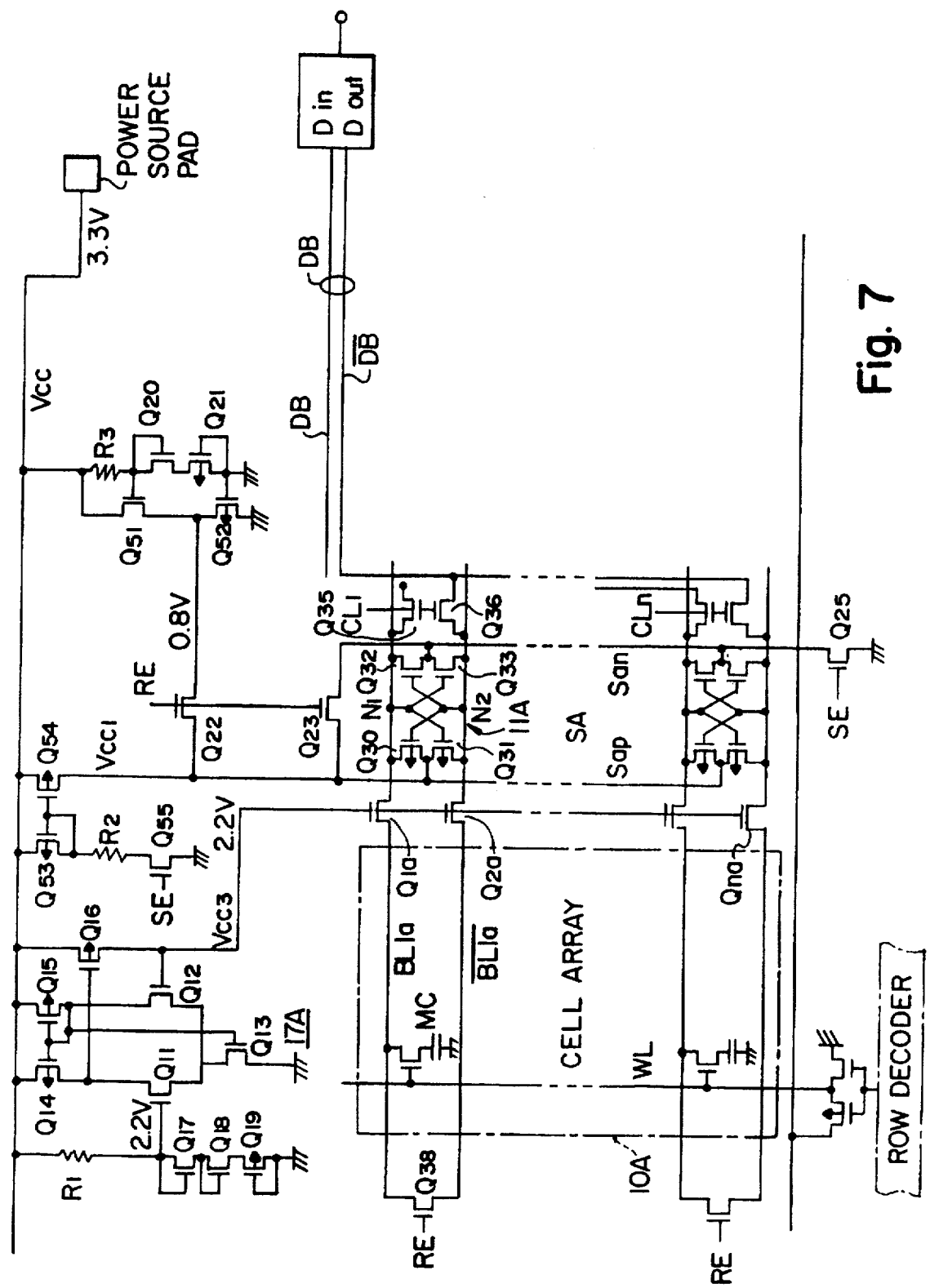
FIG. 7 shows a further embodiment of the present invention.

FIG. 7 shows a circuit diagram of a further embodiment of the present invention, in which only a single cell array 10A is used.

As described above, according to the present invention, a maximum voltage of bit lines are determined by a gate voltage of transistors connecting bit lines to sense amplifiers. Therefore, the voltages on the bit lines can be made most suitable to cells which are independent of the sense amplifiers. As a result, by driving the sense amplifiers with a voltage higher than the voltage applied to the memory cells, the data buses can be driven hard, thus speeding up memory access. Moreover, a within-chip stabilized power supply for determining the gate voltage of the transistors has only their gates as its load and thus is not required to provide large current. Thus, the power supply can be a small-sized one in which current dissipation is small.

What is claimed is:

1. A DRAM memory device comprising:
   a pair of bit lines;
   a memory cell connected to one of said bit lines;
   a sense amplifier including a flip-flop for amplifying a voltage between said pair of bit lines;
   a first power supply circuit providing a first power supply voltage to said sense amplifier;
   a pair of MOS transistors each coupled between said flip-flop and each of said pair of bit lines; and a second power supply circuit providing a second power supply voltage lower than said first power supply voltage, to a gate electrode of each of said pair of MOS transistors;
   wherein a high level at one of said pair of bit lines is limited to a voltage lower than said second power supply voltage by a threshold voltage of the MOS transistor, when said sense amplifier is in an amplifying operation.

2. A DRAM memory device comprising:
   a first pair of bit lines;
   a second pair of bit lines;
   a memory cell connected to one of said bit lines;
   a sense amplifier including a flip-flop for amplifying at least one of a voltage between said first pair of bit lines and a voltage between said second pair of bit lines;
   a first power supply circuit providing a first power supply voltage to said sense amplifier;
   a first pair of MOS transistors each coupled between said flip-flop and each of said first pair of bit lines;
   a second pair of MOS transistors each coupled between said flip-flop and each of said second pair of bit lines; and
   a second power supply circuit providing a second power supply voltage lower than said first power supply voltage, to at least one of a gate electrode of each of said first pair of MOS transistors and a gate electrode of each of said second pair of MOS transistors;
   wherein a high level at one of a selected pair of bit lines is limited to a voltage lower than said second power supply voltage by a threshold voltage of the MOS transistor, when said sense amplifier is in an amplifying operation.

3. The DRAM memory device according to claim 1, wherein said second power supply circuit selectively provides said second power supply voltage to said gate electrode of said MOS transistor.

4. The DRAM memory device according to claim 1, wherein said first power supply voltage includes an external power source voltage and said second power supply voltage includes a voltage obtained by decreasing the external power source voltage.

5. The DRAM memory device according to claim 1, wherein said second power supply circuit includes a stabilized power supply circuit.

6. The DRAM memory device according to claim 5, wherein said stabilized power supply circuit outputs a constant voltage which is lower than a voltage that said sense amplifier eventually reaches after amplification.

7. The DRAM memory device according to claim 2, further comprising a logic circuit for driving said at least one gate electrode of said first pair and second pair of MOS transistors selectively in accordance with a row address.

8. The DRAM memory device according to claim 7, wherein said logic circuit includes a stabilized power supply circuit for outputting a constant voltage which is lower than a voltage that said sense amplifier eventually reaches after amplification and a CMOS inverter turned on and off by part of said row address for supplying said at least one gate electrode of said MOS transistors with an output voltage of said stabilized power supply circuit or ground potential.

* * * * *